(12) United States Patent  
Kim

(10) Patent No.: US 10,559,718 B2
(45) Date of Patent: Feb. 11, 2020

(54) LIGHT-EMITTING DEVICE HAVING PLURAL RECESSES IN LAYERS

(71) Applicant: LG INNOTEK CO., LTD., Seoul (KR)

(72) Inventor: Chong Cook Kim, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 0 days.

(21) Appl. No.: 15/780,037

(22) PCT Filed: Nov. 30, 2016

(86) PCT No.: PCT/KR2016/014006
§ 371 (c)(1),
(2) Date: May 30, 2018

(87) PCT Pub. No.: WO2017/095154
PCT Pub. Date: Jun. 8, 2017

(65) Prior Publication Data
US 2018/0351039 A1    Dec. 6, 2018

(30) Foreign Application Priority Data

Nov. 30, 2015   (KR) .................. 10-2015-0169318

(51) Int. Cl.
*H01L 33/24*    (2010.01)
*H01L 33/00*    (2010.01)
(Continued)

(52) U.S. Cl.
CPC .............. *H01L 33/24* (2013.01); *H01L 33/06* (2013.01); *H01L 33/145* (2013.01); *H01L 33/32* (2013.01);
(Continued)

(58) Field of Classification Search
CPC ..... H01L 33/24; H01L 33/0075; H01L 33/06; H01L 33/14; H01L 33/145; H01L 33/32; H01L 33/50
See application file for complete search history.

(56) References Cited

U.S. PATENT DOCUMENTS 6,815,726 B2 * 11/2004 Ishida ................. H01L 21/0237
                                                            257/103
8,350,278 B2 *  1/2013 Komada ................. H01L 33/46
                                                            257/431
(Continued)

FOREIGN PATENT DOCUMENTS

JP    2011-91434 A     5/2011
JP    2013-120774 A    6/2013
(Continued)

*Primary Examiner* — Ida M Soward
(74) *Attorney, Agent, or Firm* — Birch, Stewart, Kolasch & Birch, LLP

(57) ABSTRACT

A light-emitting device has a first conductive semiconductor layer; an active layer arranged on the first conductive semiconductor layer, and including a plurality of first recesses; an EBL arranged on the active layer, and including a plurality of second recesses arranged on the first recesses; and a second conductive semiconductor layer arranged on the EBL. The ratio of a first area doping concentration and a second recess doping concentration is from 1:0.8 to 1:1. The active layer emits first light and second light, the first light has a peak in a wavelength of 450 nm to 499 nm, and the second light has a peak in a wavelength of 500 nm to 550 nm.

10 Claims, 11 Drawing Sheets

(51) Int. Cl.
　　*H01L 33/06* (2010.01)
　　*H01L 33/14* (2010.01)
　　*H01L 33/32* (2010.01)
　　*H01L 33/50* (2010.01)

(52) U.S. Cl.
　　CPC .......... *H01L 33/0075* (2013.01); *H01L 33/14* (2013.01); *H01L 33/50* (2013.01)

(56) References Cited

U.S. PATENT DOCUMENTS

| | | | |
|---|---|---|---|
| 8,674,384 B2 * | 3/2014 | Kataoka | H01L 33/22 257/79 |
| 8,748,867 B2 * | 6/2014 | Jeong | H01L 33/04 257/15 |
| 8,748,932 B2 * | 6/2014 | Jeong | H01L 33/10 257/103 |
| 8,754,441 B2 * | 6/2014 | Shinohara | H01L 33/025 257/101 |
| 8,952,400 B2 * | 2/2015 | Jung | H01L 33/02 257/257 |
| 9,306,119 B2 * | 4/2016 | Yamane | H01L 33/007 |
| 9,337,391 B2 * | 5/2016 | Jean | H01L 33/325 |
| 9,490,392 B2 * | 11/2016 | Ting | H01L 21/02458 |
| 10,056,524 B2 * | 8/2018 | Togawa | H01L 33/0025 |
| 10,062,805 B2 * | 8/2018 | Fujii | H01L 33/24 |
| 10,186,671 B2 * | 1/2019 | Goto | H01L 33/24 |
| 10,281,626 B2 * | 5/2019 | Jiang | G02B 5/1842 |
| 2007/0114540 A1 | 5/2007 | Lee et al. | |
| 2011/0142090 A1 * | 6/2011 | Yokozeki | B82Y 20/00 372/46.012 |
| 2012/0187365 A1 * | 7/2012 | Jeong | H01L 33/10 257/9 |
| 2014/0225059 A1 | 8/2014 | Yang et al. | |
| 2014/0332756 A1 | 11/2014 | Kashihara et al. | |
| 2015/0024531 A1 * | 1/2015 | Ting | H01L 21/02458 438/45 |
| 2015/0060762 A1 | 3/2015 | Kim et al. | |
| 2015/0115223 A1 * | 4/2015 | Kwak | H01L 21/02458 257/22 |
| 2015/0155436 A1 * | 6/2015 | Jung | H01L 33/02 257/99 |
| 2016/0087145 A1 * | 3/2016 | Kumagai | H01L 33/20 257/13 |
| 2016/0087146 A1 * | 3/2016 | Yamane | H01L 33/20 257/13 |
| 2016/0087147 A1 * | 3/2016 | Yamane | H01L 33/20 257/13 |
| 2016/0380155 A1 * | 12/2016 | Jeong | H01L 33/22 257/101 |

FOREIGN PATENT DOCUMENTS

| | | |
|---|---|---|
| KR | 10-2014-0080992 A | 7/2014 |
| KR | 10-2015-0025264 A | 3/2015 |

\* cited by examiner

【FIG. 1】
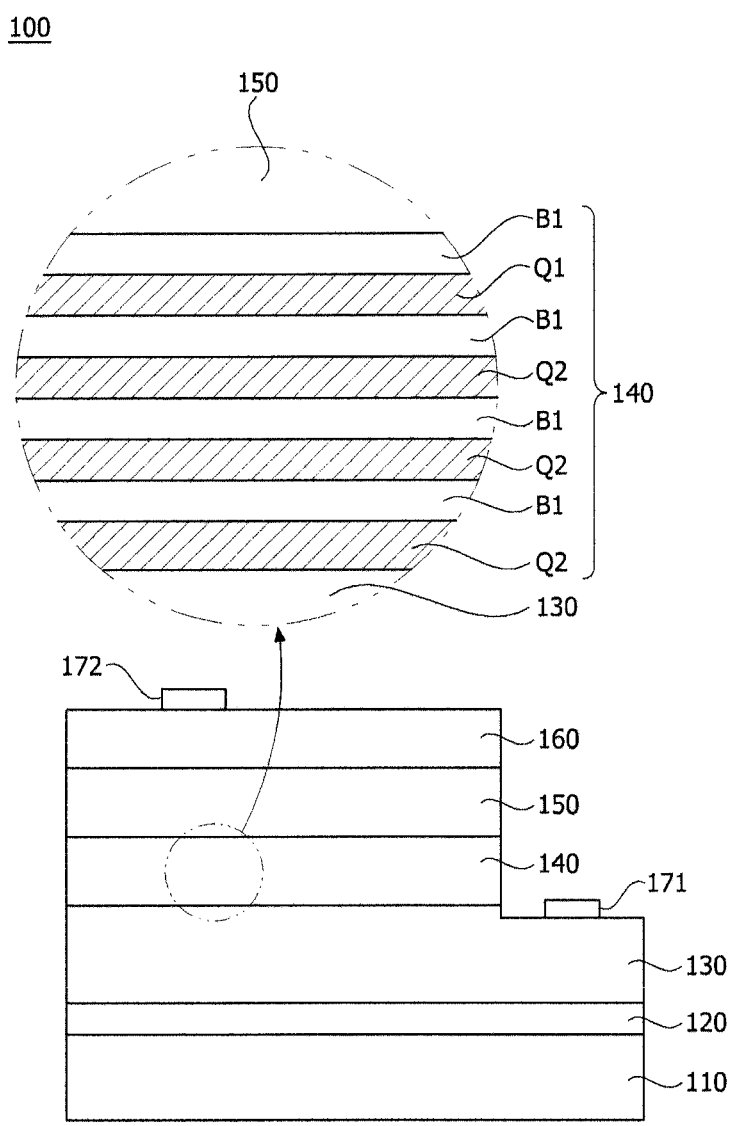

[FIG. 2]
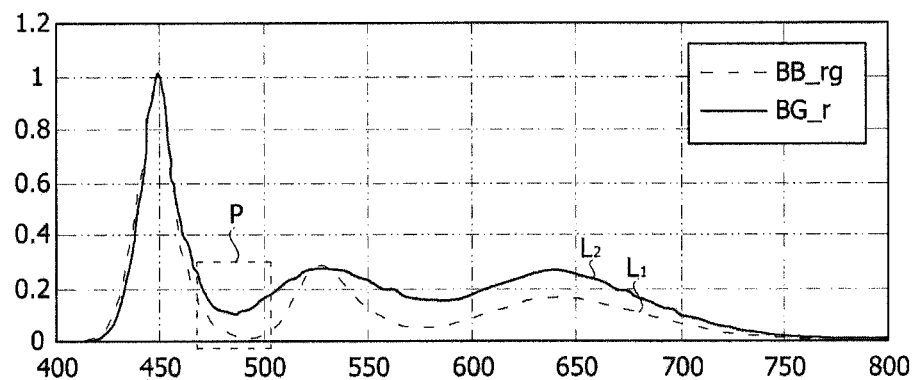
[FIG. 3]
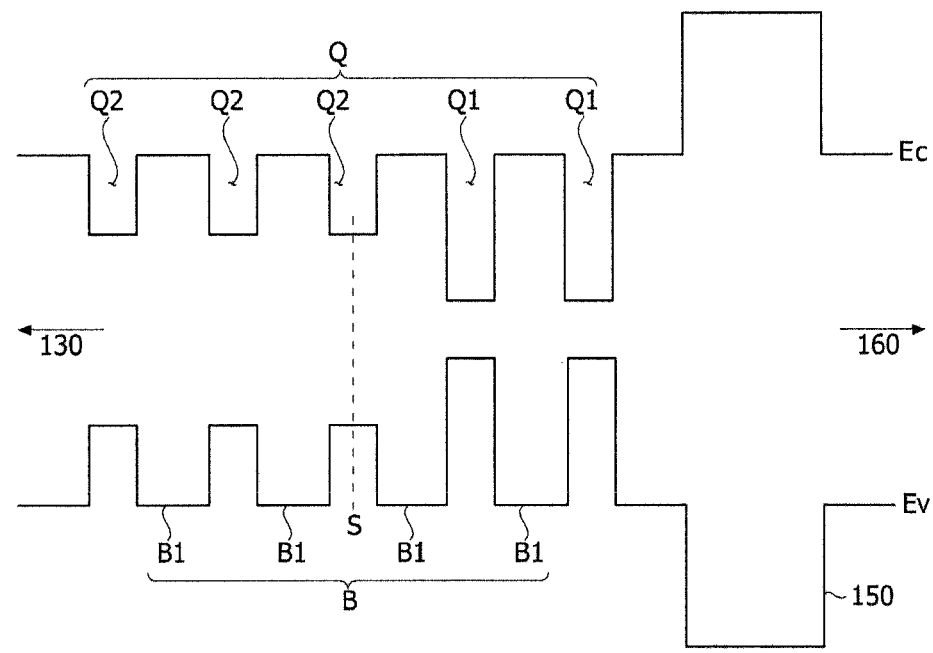

[FIG. 4]
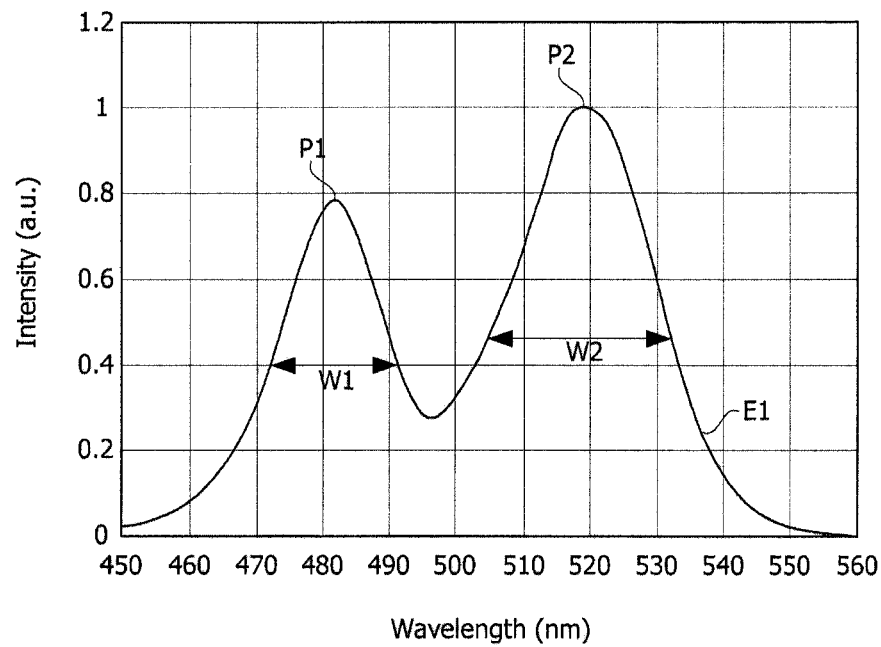
[FIG. 5]
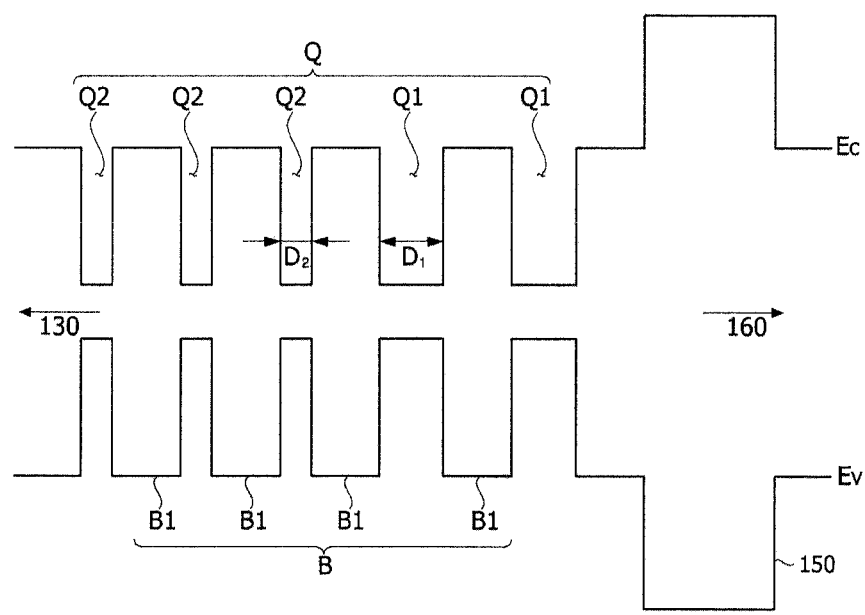

[FIG. 6]
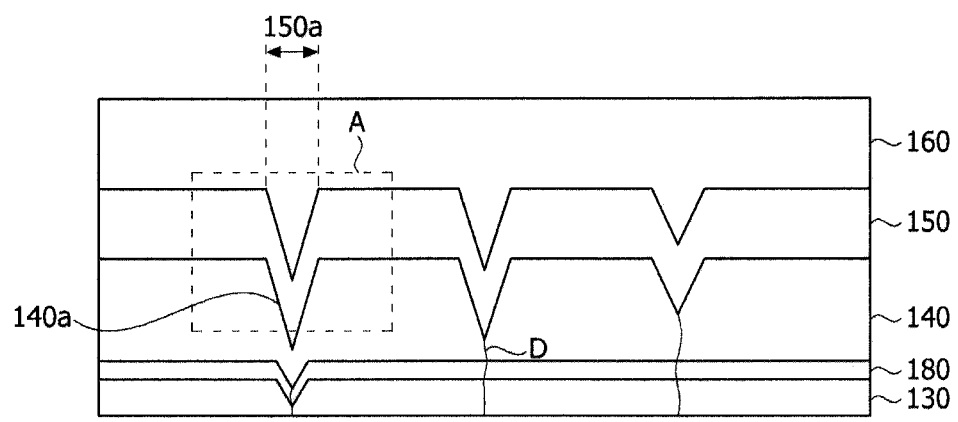
[FIG. 7]
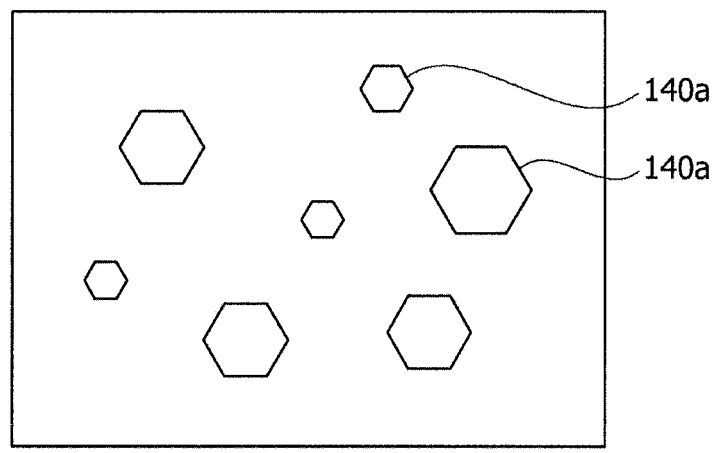

[FIG. 8]
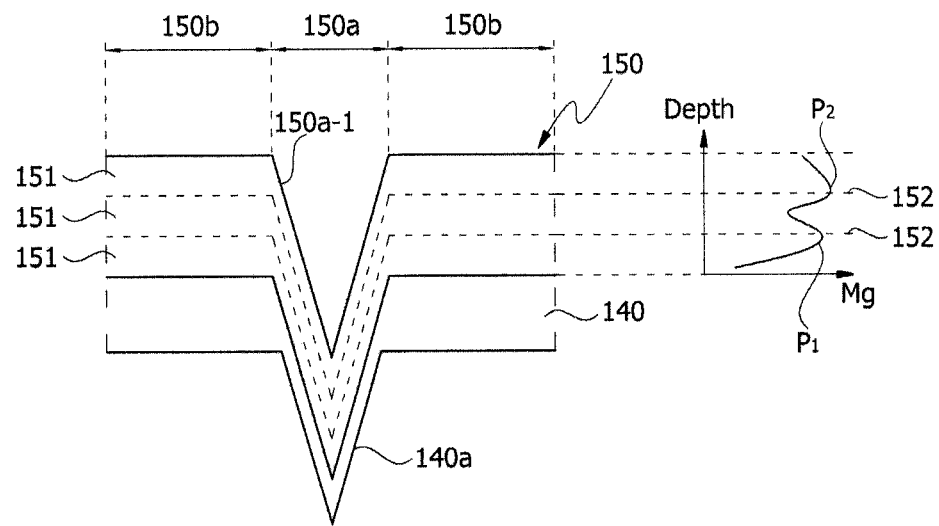
[FIG. 9]
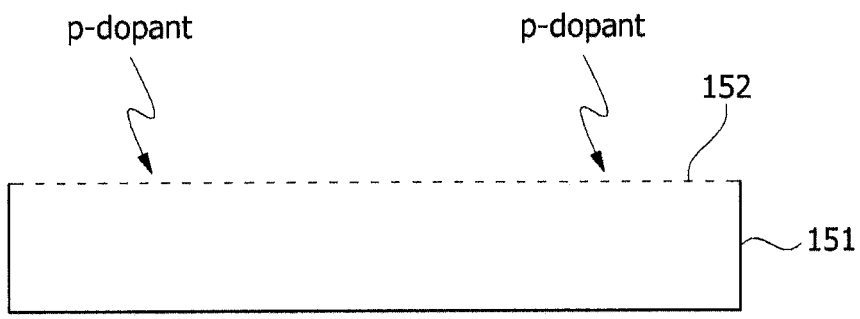

[FIG. 10]
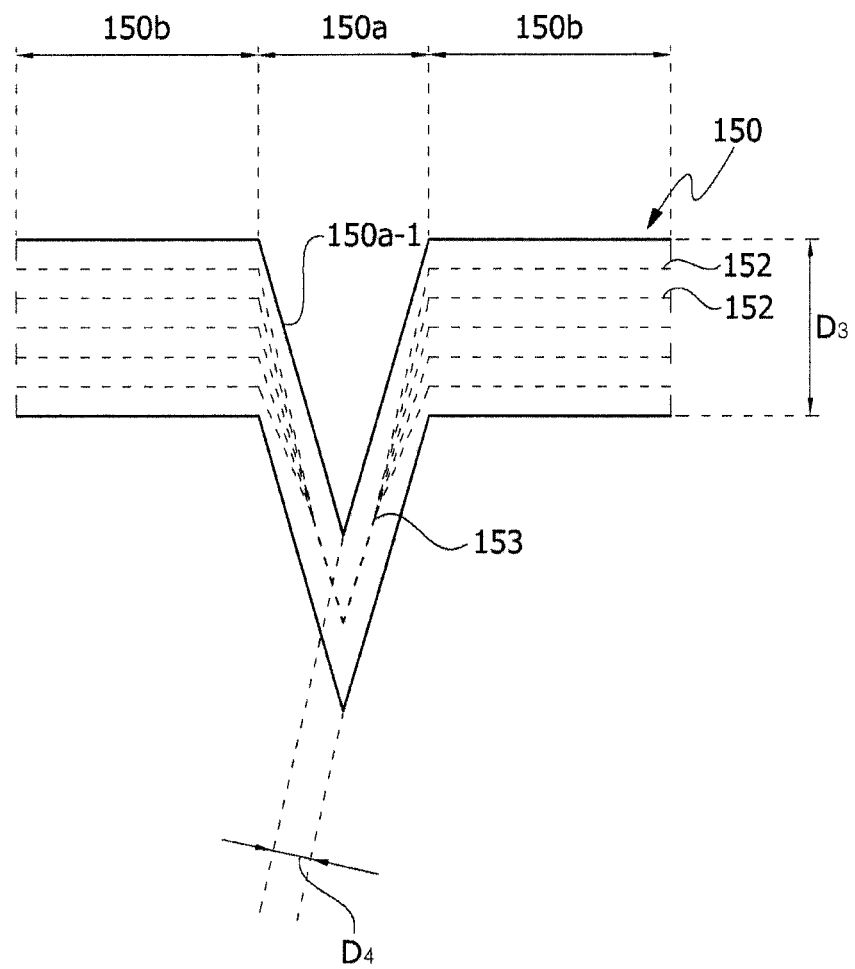

[FIG. 11]
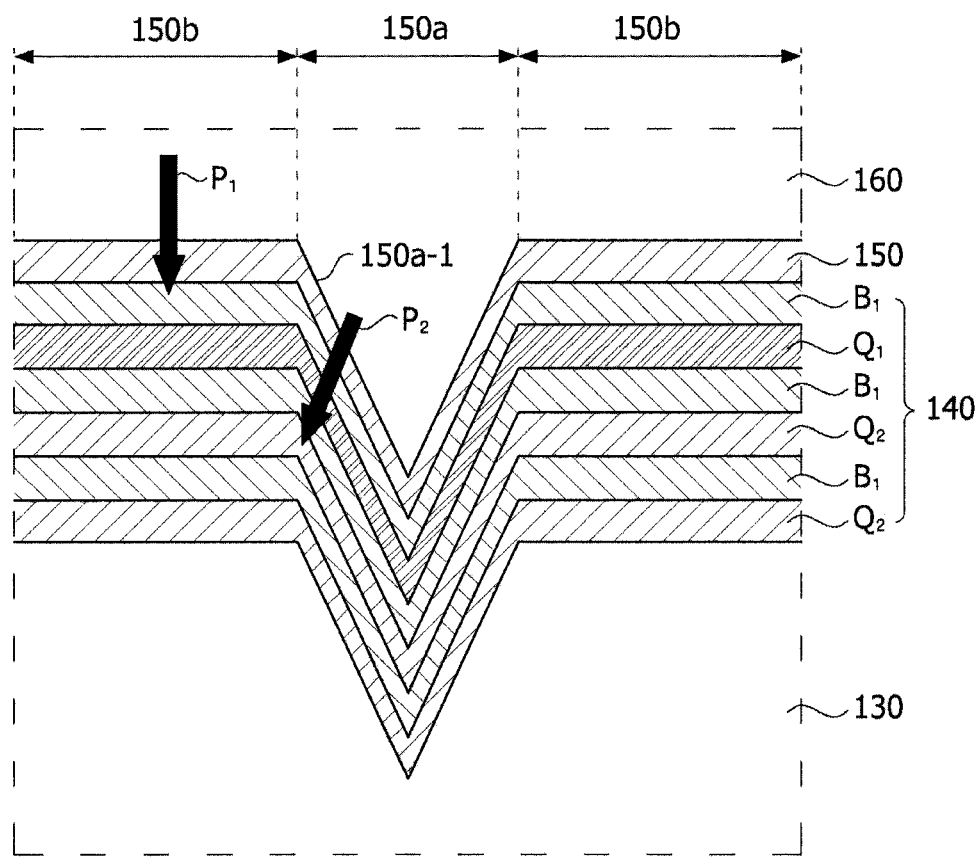

[FIG. 12]
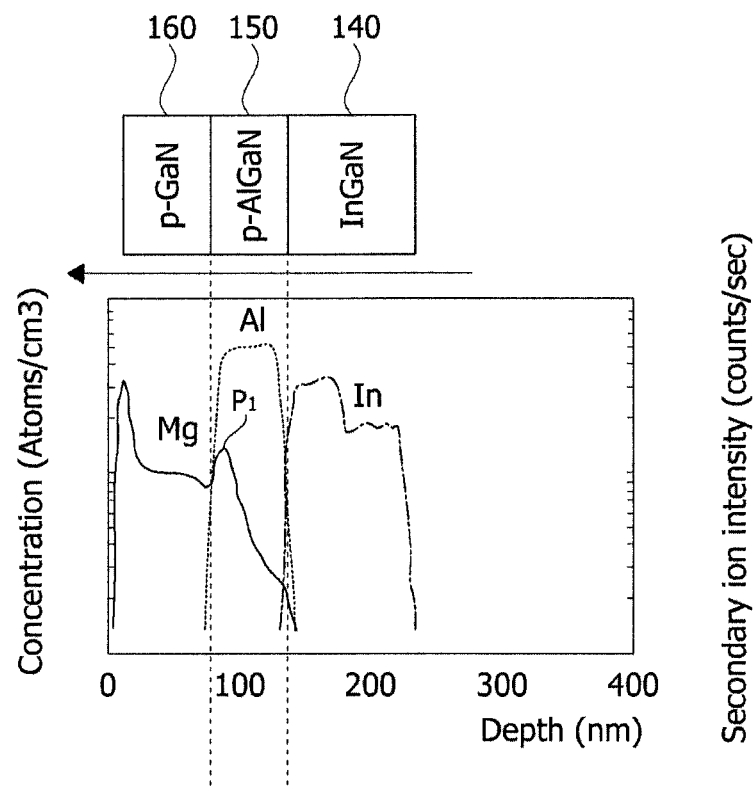

[FIG. 13]
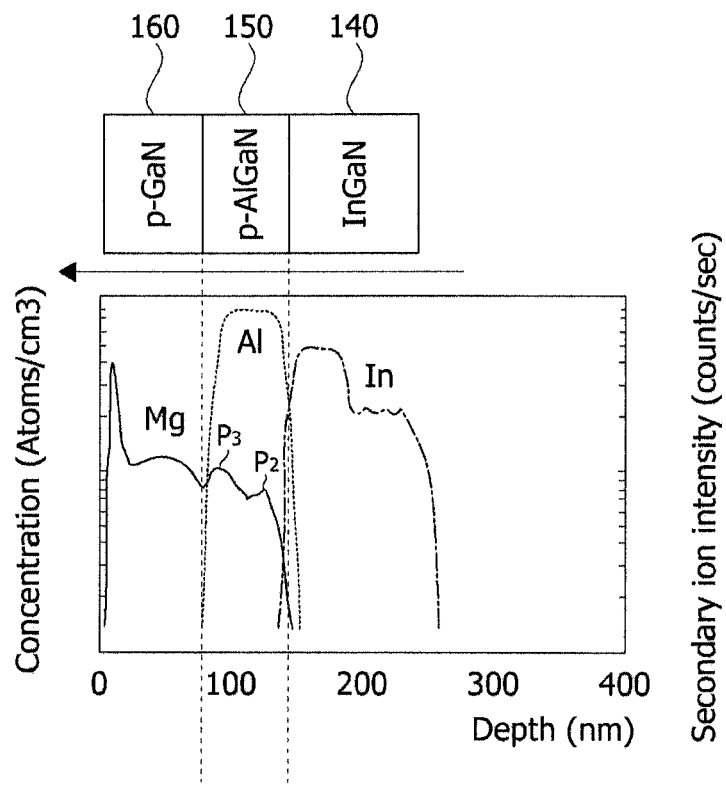
[FIG. 14]
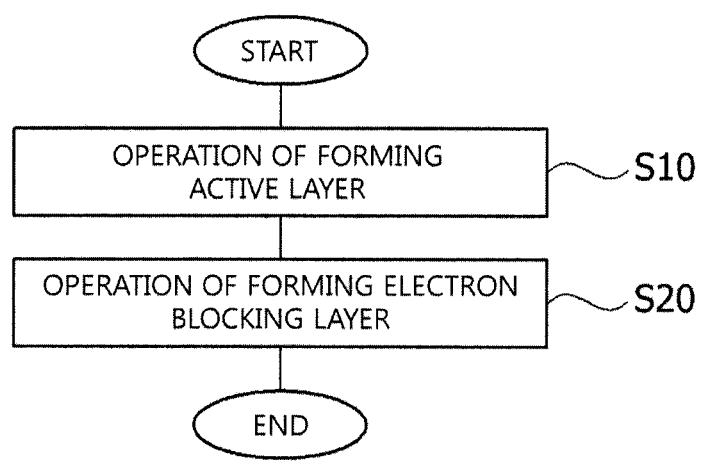

[FIG. 15]
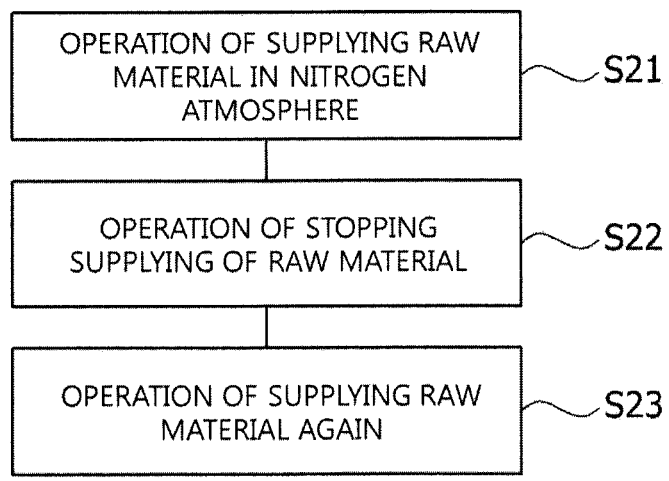
[FIG. 16]
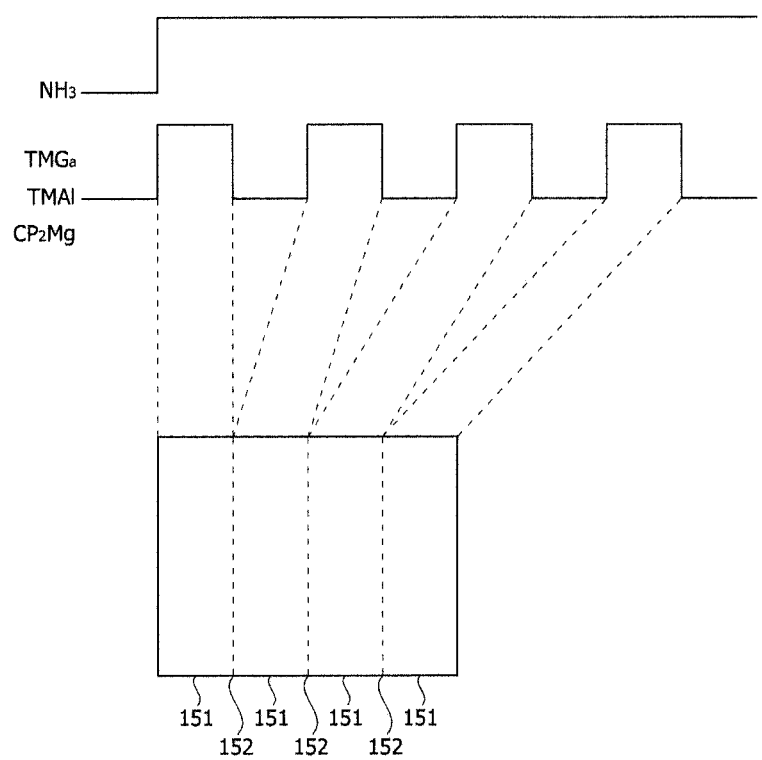

[FIG. 17]
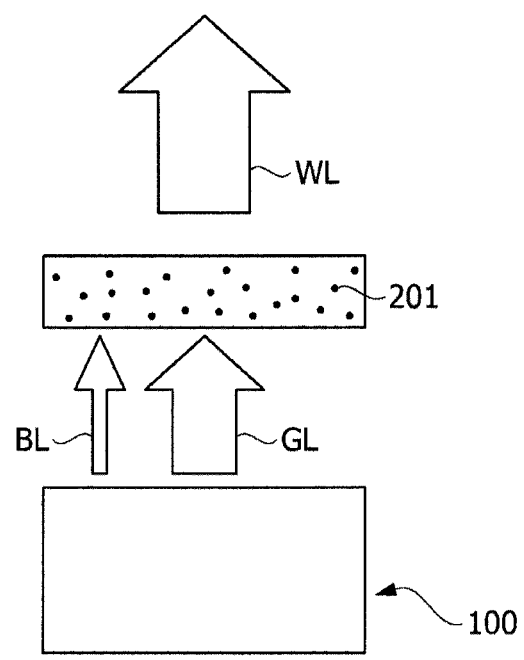

LIGHT-EMITTING DEVICE HAVING PLURAL RECESSES IN LAYERS

CROSS REFERENCE TO RELATED APPLICATIONS

This application is the National Phase of PCT/KR2016/014006 filed on Nov. 30, 2016, which claims priority under 35 U.S.C. § 119(a) to Patent Application No. 10-2015-0169318 filed in the Republic of Korea on Nov. 30, 2015, all of which are hereby expressly incorporated by reference into the present application.

TECHNICAL FIELD

The present invention relates to a light emitting device (LED) and a lighting device including the same.

BACKGROUND ART

Light emitting devices (LEDs) are compound semiconductor elements configured to convert electrical energy into light energy and may develop various colors by adjusting a composition ratio of a compound semiconductor.

Nitride semiconductor LEDs have advantages of low power consumption, semi-permanent lifetime, fast response speed, safety, and environmental friendliness when compared to conventional light sources such as fluorescent lamps and incandescent lamps. Accordingly, the nitride semiconductor LEDs are widely applied to light-emitting diode backlights that replace cold cathode fluorescent lamps (CCFLs) that constitute backlights of liquid crystal display (LCD) devices, white light-emitting diode lightings which can replace fluorescent or incandescent bulbs, vehicle headlights, and traffic lights.

However, white light using an LED has a problem of a low color rendering index (CRI). To solve this problem, there is a problem in that a phosphor configured to be excited in various wavelength bands has to be used.

Technical Problem

The present invention is directed to providing a light emitting device (LED) configured to emit blue light and green light.

The present invention is also directed to providing a lighting device in which a color rendering index (CRI) is improved.

Technical Solution

One aspect of the present invention provides a light emitting device (LED) including: a first conductive semiconductor layer; an active layer disposed on the first conductive semiconductor layer and including a plurality of first recesses; an electron blocking layer (EBL) including a plurality of second recesses disposed on the first recesses and a first region disposed between the plurality of second recesses; and a second conductive semiconductor layer disposed on the EBL, wherein a ratio of a doping concentration of the first region to a doping concentration of the second recess is in a range of 1:0.8 to 1:1, the active layer generates first light and second light, the first light has a peak in a wavelength band of 450 nm to 499 nm, and the second light has a peak in a wavelength band of 500 nm to 550 nm.

The EBL may include a first carrier injecting path formed in the first region between the plurality of second recesses and a second carrier injecting path formed at a sidewall of the second recesses.

The plurality of second recesses may have a thickness smaller than that of the first region.

The EBL may have at least two concentration peaks of a p-type dopant in a thickness direction thereof.

The EBL may include a plurality of sublayers, and the p-type dopant may have a concentration peak at interfaces between the plurality of sublayers.

The interfaces between the plurality of sublayers may overlap at the sidewall of the recesses.

A peak intensity of the first light may be in a range of 30% to 80% of a 100% peak intensity of the second light.

The active layer may include at least one first well layer configured to emit the first light and at least one second well layer configured to emit the second light.

The first well layer may be disposed adjacent to the second conductive semiconductor layer based on a one-half point of the active layer in a thickness direction.

A difference in content of indium (In) between the first well layer and the second well layer may be 10% or more.

The first light may have a peak in a wavelength band of 470 nm to 490 nm, and the second light may have a peak in a wavelength band of 510 nm to 530 nm.

The LED may further include a trigger layer disposed between the first conductive semiconductor layer and the active layer.

An In composition of the trigger layer may be higher than that of the first conductive semiconductor layer.

Another aspect of the present invention provides a light emitting device (LED) including an n-type semiconductor layer; an active layer including a plurality of well layers; and a p-type semiconductor layer disposed on the active layer, wherein well layers among the plurality of well layers adjacent to the n-type semiconductor layer based on a boundary point which is a one-half of a thickness of the active layer emit blue light, and well layers among the plurality of well layers adjacent to the p-type semiconductor layer based on the boundary point emit blue light and green light.

An electron blocking layer (EBL) may be disposed on the active layer and include a plurality of second recesses.

The EBL may include a first carrier injecting path formed in a first region between the plurality of second recesses and a second carrier injecting path formed at a sidewall of the second recess.

Advantageous Effects

According to the embodiments, a color rendering index (CRI) of white light can be improved. Particularly, a CRI of R12 can be improved even without an additional phosphor.

In addition, efficiency of hole injection into an electron blocking layer (EBL) can be improved. Accordingly, a problem in that light properties are lowered can be improved even when a size of a recess is increased.

In addition, since holes can be injected into a lower portion of an active layer, light emitting efficiency can be improved. Accordingly, a droop phenomenon can be reduced.

Various useful merits and effects of the present invention are not limited to the above effects and can be more easily understood from specific embodiments of the present invention which will be described below.

DESCRIPTION OF DRAWINGS

FIG. 1 is a view illustrating a light emitting device (LED) according to one embodiment of the present invention.

FIG. 2 is a graph for describing a color rendering index (CRI) of white light.

FIG. 3 is a view illustrating an energy band diagram of the LED according to one embodiment of the present invention.

FIG. 4 is a graph for describing an optical property of the LED according to one embodiment of the present invention.

FIG. 5 is a view illustrating a modified example of FIG. 3.

FIG. 6 is a view for describing recesses formed in an active layer and an electron blocking layer (EBL) of FIG. 1.

FIG. 7 is a plan view illustrating recesses having various sizes and formed in the LED of FIG. 6.

FIG. 8 is a view for describing the EBL according to one embodiment of the present invention.

FIG. 9 is a view for describing a process of doping an interface between sublayers of the EBL with a p-type dopant.

FIG. 10 is a view for describing a state in which interfaces of FIG. 9 overlap.

FIG. 11 is a view for describing a carrier injecting path of the EBL according to one embodiment of the present invention.

FIG. 12 is a view illustrating an analysis result of a conventional LED using a secondary ion mass spectroscopy (SIMS).

FIG. 13 is a view illustrating an analysis result of the LED according to one embodiment of the present invention using the SIMS.

FIG. 14 is a flowchart of a method of manufacturing an LED according to one embodiment of the present invention.

FIG. 15 is a detailed flowchart of a process in which the EBL is formed.

FIG. 16 is a timing diagram for describing a process in which interfaces between sublayers are formed due to interruption periods.

FIG. 17 is a view for describing a process in which white light is realized using the LED according to the embodiment of the present invention.

MODES OF THE INVENTION

As the present invention allows for various changes and numerous embodiments, exemplary embodiments will be illustrated in the drawings and described in detail in the written description. However, this is not intended to limit the embodiments of the present invention to particular modes of practice, and it is to be appreciated that all changes, equivalents, and substitutes that do not depart from the spirit and technical scope of the embodiments are encompassed in the embodiments.

It will be understood that, although the terms "first," "second," etc. may be used herein to describe various elements, the elements should not be limited by the terms. The terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terms used in the present specification are merely used to describe exemplary embodiments and are not intended to limit the embodiments of the present invention. An expression used in the singular encompasses the expression of the plural, unless it has a clearly different meaning in the context. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

In the description of the embodiment, in a case in which any one element is described as being formed on (or under) another element, such the description includes both a case in which the two elements are formed to be in direct contact with each other and a case in which the two elements are in indirect contact with each other such that one or more other elements are interposed between the two elements. In addition, when in a case in which one element is described as being formed on (or under) the other element, such a description may include a case in which one element is formed at an upper side or a lower side based on the other element.

Hereinafter, embodiments will be described in detail with reference to the accompanying drawings, components that are the same or correspond to each other regardless of reference numerals are referred to by the same or similar reference numerals, and repetitive descriptions thereof will be omitted, FIG. 1 is a view illustrating a light emitting device (LED) according to one embodiment of the present invention.

Referring to FIG. 1, an LED 100 according to the embodiment of the present invention includes a first conductive semiconductor layer 130 disposed above a support substrate 110, an active layer 140 disposed on the first conductive semiconductor layer 130 and including well layers Q1 and Q2 and barrier layers B1, and a second conductive semiconductor layer 160 formed above the active layer 140.

The support substrate 110 may include a conductive substrate or insulating substrate. The support substrate 110 may be a material suitable for growing a semiconductor material or a carrier wafer. The support substrate 110 may be formed of a material selected from among sapphire ($Al_2O_3$), SiC, GaAs, GaN, ZnO, Si, GaP, InP, and Ge, but is not limited thereto.

A buffer layer 120 may be further provided between the first conductive semiconductor layer 130 and the support substrate 110. The buffer layer 120 may reduce lattice mismatching between a light emitting structure formed above the support substrate 110 and the support substrate 110.

The buffer layer 120 may be formed of a material in which elements of Group III and Group V are combined or include any one among GaN, InN, AlN, InGaN, AlGaN, InAlGaN, and AlInN. The buffer layer 120 may be doped with a dopant but is not limited thereto.

The buffer layer 120 may be grown as a single crystal on the support substrate 110, and crystallinity of the first conductive semiconductor layer 130 grown on the buffer layer 120 may be improved due to the buffer layer 120 grown as the single crystal.

The light emitting structure formed above the support substrate 110 includes the first conductive semiconductor layer 130, the active layer 140, and the second conductive semiconductor layer 160. Generally, the light emitting structure may be divided into a plurality of light emitting structures by cutting the support substrate 110.

The first conductive semiconductor layer 130 may be formed of a compound semiconductor such as a III-V compound semiconductor or a II-VI compound semiconductor, and the first conductive semiconductor layer 130 may be doped with a first dopant. The first conductive semiconductor layer 130 may be selected from among semiconductor materials having a composition formula of $In_{x1}Al_{y1}Ga_{1-x1-y1}N$ ($0 \leq x1 \leq 1$, $0 \leq y1 \leq 1$, $0 \leq x1+y1 \leq 1$), for example, GaN, AlGaN, InGaN, and InAlGaN. In addition, the first dopant may be an n-type dopant such as Si, Ge, Sn, Se, or Te. In a case in which the first dopant is an n-type dopant, the first conductive semiconductor layer 130 doped with the first dopant may be an n-type semiconductor layer.

The active layer 140 is a layer in which electrons (or holes) injected through the first conductive semiconductor layer 130 meet holes (or electrons) injected through the second conductive semiconductor layer 160. As the electrons and the holes are recombined in the active layer 140 and transitioned to a lower energy level, the active layer 140 may generate light having a corresponding wavelength.

The active layer 140 may have any one structure among a single well structure, a multi well structure, a single quantum well structure, a multi quantum well (MQW) structure, a quantum dot structure, and a quantum line structure, but is not limited thereto.

The second conductive semiconductor layer 160 may be formed above the active layer 140, formed of a compound semiconductor such as a III-V compound semiconductor or a II-VI compound semiconductor, and doped with a second dopant. The second conductive semiconductor layer 160 may be formed of a semiconductor material having a composition formula of $In_{x5}Al_{y2}Ga_{1-x5-y2}N$ ($0 \leq x5 \leq 1$, $0 \leq y2 \leq 1$, $0 \leq x5+y2 \leq 1$) or a material selected from among AlInN, AlGaAs, GaP, GaAs, GaAsP, and AlGaInP. In a case in which the second dopant is a p-type dopant such as Mg, Zn, Ca, Sr, or Ba, the second conductive semiconductor layer 160 doped with the second dopant may be a p-type semiconductor layer.

An electron blocking layer (EBL) 150 may be disposed between the active layer 140 and the second conductive semiconductor layer 160. The EBL 150 may block a flow of electrons supplied from the first conductive semiconductor layer 130 to the second conductive semiconductor layer 160 to increase a recombination probability of an electron and a hole in the active layer 140. An energy band gap of the EBL 150 may be greater than that of the active layer 140 and/or the second conductive semiconductor layer 160.

The EBL 150 may be selected from among semiconductor materials having a composition formula of $In_{x1}Al_{y1}Ga_{1-x1-y1}N$ ($0 \leq x1 \leq 1$, $0 \leq y1 \leq 1$, $0 \leq x1+y1 \leq 1$), for example, AlGaN, InGaN, and InAlGaN, but is not limited thereto.

A first electrode 171 may be disposed on an exposed portion of the first conductive semiconductor layer 130. In addition, a second electrode 172 may be disposed on the second conductive semiconductor layer 160.

FIG. 2 is a graph for describing a color rendering index (CRI) of white light. Referring to FIG. 2, a white LED package BB-rg including two blue LEDs, a green phosphor, and a red phosphor has a low intensity of a light spectrum L1 within a wavelength band P of 470 nm to 520 nm. On the other hand, a white LED package BG-r including a blue LED, a green LED, and a red phosphor has a relatively high intensity within the wavelength band P of 470 nm to 520 nm. However, in a case in which the blue LED and the green LED are used, since a plurality of chips are packaged, there is a problem in that a process thereof is complex, and the intensity may be still insufficient within the band P of 470 nm and 520 nm.

A CRI is an index that a light source to reveal the inherent colors of objects into natural colors is evaluated. The CRI is classified into an average CRI Ra which is an average of color values of eight colors including R1 to R8 and special CRIs (R9 to R15).

The special CRIs include R9 for red, R10 for yellow, R12 for blue, and the like. Generally, CRIs of R9 for red and R12 for blue tend to be lowered. In FIG. 2, the wavelength band P of 470 nm and 520 nm may correspond to the CRI of R12.

Accordingly, when intensity in the wavelength band of 470 nm to 520 nm is increased, the CRI of R12 may be further increased.

FIG. 3 is a view illustrating an energy band diagram of the LED according to one embodiment of the present invention, FIG. 4 is a graph for describing an optical property of the LED according to one embodiment of the present invention, and FIG. 5 is a view illustrating a modified example of FIG. 3.

Referring to FIG. 3, the active layer 140 may have a structure in which well layers Q and barrier layers B are alternately disposed. The well layers Q may include at least one first well layer Q1 and at least one second well layer Q2.

The first well layer Q1 may emit a second light having a peak in a wavelength band of 500 nm to 550 nm. In addition, the second well layer Q2 may emit a first light having a peak in a wavelength band of 450 nm to 499 nm. Hereinafter, the light emitted by the first well layer Q1 is defined as green light, and the light emitted by the second well layer Q2 is defined as blue light.

The active layer 140 according to the embodiment may simultaneously emit the blue light and the green light. The green light may be main light emitted by the LED, and the blue light may be sub light for increasing the CRI of R12.

The blue light may have a first peak within a wavelength band of 450 nm to 499 nm, or a wavelength band of 470 nm to 490 nm. The green light may have a second peak within a wavelength band of 500 nm to 550 nm, or a wavelength band of 510 nm to 530 nm. A difference in wavelength between the first and second peaks may be about 40 nm.

The first well layer Q1 may be disposed adjacent to the EBL 150 and the second conductive semiconductor layer 160 based on a boundary point S which is a one-half point in a thickness direction of the active layer 140. Since a mobility of a hole, which is a carrier, is lower than that of an electron due to effective mass, as a well layer is disposed closer to the EBL 150, a larger number of holes may be injected into the well layer and light emitting efficiency thereof may be increased. Accordingly, the first well layer Q1 may be disposed adjacent to the EBL 150 and the second conductive semiconductor layer 160 to have sufficient light emitting intensity. Accordingly, the first well layer Q1 adjacent to the p-type semiconductor layer 160 based on the boundary point S and the second well layer Q2 may emit the blue light and the green light, respectively. Conversely, the second well layer Q2 adjacent to the n-type semiconductor layer 130 based on the boundary point may emit blue light.

The first well layer Q1 and the second well layer Q2 may have a composition formula of $In_xAl_yGa_{1-x-y}N$ ($0 \leq x \leq 1$, $0 \leq y \leq 1$, $0 \leq x+y \leq 1$). An energy band gap of the well layer Q may decrease as a content of indium (In) increases, and conversely, the energy band gap thereof may increase as the content thereof decreases. Accordingly, the content of In of the first well layer Q1 may be higher than that of the second well layer Q2. That is, the energy band gap of the first well layer Q1 may be less than that of the second well layer Q2.

The content of In of the first well layer Q1 may be in a range of 20% to 30% to emit the green light. The content of In of the second well layer Q2 may be in a range of 14% to 24% to emit the blue light. All thicknesses thereof may be in a range of 2.2 nm to 2.7 nm.

A difference in content of In between the first well layer Q1 and the second well layer Q2 may be adjusted to be 5% or more to adjust a wavelength of emitted light. As one example, in a case in which the content of In of the second well layer Q2 is 20%, the content of In of the first well layer Q1 may be 25%.

Referring to FIG. 4, an intensity of the blue light at a first peak P1 may be in a range of 30% to 80% of a 100% intensity of the green light at a second peak P2 in a light spectrum E1. In a case in which the intensity at the first peak P1 is in a range of 30% to 80%, white light having a high CRI may be realized by effectively improving the CRI of R12. When the intensity at the first peak P1 is higher than 80%, the intensity of the emitted green light may be relatively lowered.

A full width at half maximum W1 of the blue light may be narrower than that of the green light. Light emitting intensity of the blue light may be adjusted to be high at a wavelength of R12. When the full width at half maximum W1 of the blue light is widened, the intensity thereof is relatively lowered and an improvement of the CRI of R12 may be lowered. Conversely, a full width at half maximum W2 of the green light may be widened to emit high CRI white light. Accordingly, the full width at half maximum W2 of the green light may be wider than the full width at half maximum W1 of the blue light.

Referring to FIG. 5, band gaps of the first well layer Q1 and the second well layer Q2 may be adjusted by adjusting thicknesses of well layers. An energy level of light generated in a well layer may satisfy the following Equation 1.

$$E_n = \frac{n^2 h^2 \pi^2}{2mL}$$ [Equation 1]

Here, L corresponds to a thickness of a well layer. As the thickness of the well layer increases, an energy level of light generated by the well layer decreases. Accordingly, an energy level of the first well layer Q1 may be decreased by adjusting a thickness D1 of the first well layer Q1 to be greater than a thickness D2 of the second well layer Q2. Therefore, the first well layer Q1 may emit green light.

The thickness of the first well layer Q1 may be in a range of 2.0 nm to 3.5 to emit green light. The thickness of the second well layer Q2 may be in a range of 1.5 nm to 3.4 nm to emit blue light. Here, a difference in thickness between the first well layer Q1 and the second well layer Q2 may be adjusted to be 10% or more to adjust a wavelength of emitted light. As one example, in a case in which the thickness of the second well layer Q2 is 2.0 nm, the thickness of the first well layer Q1 may be 2.5 nm.

Further referring to FIG. 3, there is a problem in that internal strain of the active layer Q increases as a composition of In increases in the active layer Q. Accordingly, it may be preferable that the second well layer Q2 which is relatively stable (has a lower composition of In) be first grown. However, as described above, since a mobility of a hole is relatively low, most of a plurality of second well layers Q2 disposed at a side of the first conductive semiconductor layer 130 may not participate in emitting light.

In addition, since a growing temperature of the EBL 160 has to be decreased to protect the first well layer Q1 having a relatively high composition of In, crystallinity thereof is reduced and thus a mobility of a hole may be further lowered. Accordingly, there is a need to form a carrier injecting path to allow the second well layer disposed adjacent to the first conductive semiconductor layer to participate in emitting light. Hereinafter, a method of injecting holes into the well layer disposed at a side of the first conductive semiconductor layer (into a lower portion of the well layer) will be described.

FIG. 6 is a view for describing recesses formed in the active layer and the EBL of FIG. 1, and FIG. 7 is a plan view illustrating recesses having various sizes and formed in the LED of FIG. 6.

Referring to FIGS. 6 and 7, the active layer 140 may include first recesses 140a having a V shape caused by an electric potential D. The first recess 140a may reduce strain between the first conductive semiconductor layer 130 and the active layer 140 and prevent extension of the electric potential D to the active layer 140 and the second conductive semiconductor layer 160 so that quality of the LED may be improved.

The first recess 140a may prevent a leakage current due to the electric potential D. However, since a region in which the first recesses 140a are formed may not participate in emitting light, light intensity may be lowered. Referring to FIG. 7, the first recesses 140a may have various sizes.

Since the EBL 150 is formed on the active layer 140 having the first recesses 140a, the EBL 150 may have second recesses 150a corresponding to a shape of the first recess 140a (region A).

FIG. 8 is a view for describing the EBL according to one embodiment of the present invention, FIG. 9 is a view for describing a process of doping an interface between sublayers of the EBL with a p-type dopant, FIG. 10 is a view for describing a state in which interfaces of FIG. 9 overlap, and FIG. 11 is a view for describing a carrier injecting path of the EBL according to one embodiment of the present invention.

Referring to FIG. 8, the EBL 150 incudes a plurality of second recesses 150a and regions (hereinafter, referred to as first regions) between the second recesses 150a. The first regions 150b may be relatively planar regions when compared to the second recesses 150a. The first region 150b may be defined as a region grown from a crystal face (0001), and the second recess 150a may be defined as a region grown from a crystal face (1-101).

The EBL 150 may be doped with a p-type dopant to improve injection efficiency. When the p-type dopant is doped, since resistance can be decreased, and the injection efficiency can be increased. The p-type dopant may include any one or more selected from the group consisting of Mg, Zn, Ca, Sr, and Ba.

Generally, in the first region, since a concentration of the p-type dopant is high, hole injection is easy, but in the recess, since a concentration of Al is relatively high and the concentration of the p-type dopant is low, hole injection may be difficult. That is, a resistance of an inclined surface of the recess may be higher than that of the first region.

To solve such a problem, the EBL 150 according to the embodiment may include a plurality of sublayers 151 and have a concentration peak section (hereinafter, referred to as a peak section) of the p-type dopant at interfaces 152 between the plurality of sublayers 151. All the plurality of sublayers 151 may include the same constituent element. As an example, all the sublayers 151 may include AlGaN doped with Mg. Accordingly, the EBL 150 may have a substantially uniform energy band gap in a thickness direction thereof.

The peak section may be defined as a point of inflection of a gradient of a concentration of the p-type dopant in a thickness (distance or depth) direction. The interface 152 may be a virtual line by which the peak sections are connected. The sublayer 151 may be a layer having physical boundary, but is not limited thereto, and may also be a virtual layer vertically defined based on the peak section.

Since the plurality of sublayers 151 may have a plurality of peak sections at the interfaces 152, a doping concentration of the EBL 150 may be relatively high. In FIG. 8, an example of the EBL 150 has two peak sections P1 and P2 in the thickness direction. According to such a configuration, since the concentration of the p-type dopant in the second recess 150a of the EBL 150 increases, the injection efficiency may increase.

The peak sections may be formed at the interfaces 152 of the sublayers 151 by applying interruption periods when the sublayer 151 is formed. Referring to FIG. 9, during the interruption period, the dispersed p-type dopant therearound may be combined with a surface (the interface) of the sublayer 151 in which growth of the p-type dopant is stopped.

That is, the interruption period may provide a time for which the p-type dopant is combined with the surface (interface) of the sublayer 151. Accordingly, by providing a plurality of interruption periods, the plurality of peak sections may be formed in the thickness direction and a concentration of the dopant may be increased.

However, when the interruption period is too long, there may be a problem in that the p-type dopant combined with the surface of the sublayer 151 is volatilized again. Accordingly, the interruption period is preferably controlled to be relatively short such that the p-type dopant is not volatilized again. When an interval of the interruption period is controlled to be in a range of about one sec to ten sec, the p-type dopant combined with the surface may be effectively confined in the sublayer 151.

Referring to FIG. 10, the interface 152 may be seen in the first region 150b. Since a thickness D4 of a sidewall 150a-1 of the second recess is relatively small, parts of the plurality of interfaces 152 may overlap within the second recess 150a. Accordingly, as the number of the interfaces 152 increases, the concentration of the p-type dopant at the sidewall 150a-1 of the second recess may further increase. That is, injection efficiency of the second recess may further be improved.

Since a hole has a relatively heavy effective mass, when the thickness of the EBL 150 is not small, injection efficiency may decrease. The thickness D4 of the second recess 150a formed in the EBL 150 may be smaller than a thickness D3 of the first region 150b. The thickness D4 of the second recess 150a may be in a range of 20% to 70% of the thickness D3 of the first region 150b. For example, a ratio of the thickness D3 of the first region 150b to the thickness D4 of the second recess 150a may be 1.69:0.95.

According to the embodiment, since the concentration of the p-type dopant of the second recess 150a is high and a resistance thereof is low, hole injection may be accelerated. The concentration of p-type dopant of the second recess 150a may be in a range of $1\times10^{19}/cm^3$ to $1\times10^{21}/cm^3$. In addition, the concentration of the p-type dopant of the first region 150b may also be in a range of $1\times10^{19}/cm^3$ to $1\times10^{21}/cm^3$. As described above, the concentrations of the dopants of the second recess 150a and the first region 150b may be uniform due to the interruption period.

The ratio of the doping concentration of the first region 150b to the doping concentration of the second recess 150a may be in a range of 1:0.8 to 1:1. When the ratio of the doping concentrations is less than 1:0.8, since the doping concentration of the second recess 150a is low, carrier injection efficiency from the sidewall of the second recess 150a may decrease. As a result, since carriers are not injected into the lower portion of the well layer, light efficiency may be decreased. In addition, since doping the sidewall of the second recess 150a is relatively difficult, it may be difficult that the concentration ratio is greater than 1:1 even when a time is increased.

Referring to FIG. 11, a first carrier injecting path P1 may be formed within the first region 150b and a second carrier injecting path P2 may be formed at the sidewall 150a-1 of the second recess in the EBL 150 according to the above-described structure. Most holes injected through the first carrier injecting path P1 may be injected into one to two first well layers Q1 closest to the EBL. Accordingly, most of the holes injected though the first carrier injecting path P1 may participate in emitting green light.

Holes injected through the second carrier injecting path P2 may be relatively injected into all well layers Q1 and Q2. Since a thickness of the recess of the active layer 140 is relatively small, the holes may be injected into the sidewall of the second well layer Q2. Accordingly, the second well layer Q2 adjacent to the first conductive semiconductor layer 130 may also participate in emitting light. As described above, since the second well layer Q2 mainly emits blue light, the second well layer Q2 may emit light having intensity for satisfying R12. That is, even when a light emitting area is decreased due to the recess, since the number of well layers configured to participate in emitting light is increased, overall light emitting intensity may be increased.

The following Table 1 is a result of adjusting an area ratio by adjusting the number or an area of the recesses (V-pit).

TABLE 1

| | Diameter (μm) | Area (μm²) | Number (ea/10 μm × 10 μm) | Density (1 × 10⁸ ea/ cm²) | Area Ratio |
|---|---|---|---|---|---|
| Comparative Example | 0.18 | 0.02543 | 155 | 1.6 | 4% |
| Example 1 | 0.3 | 0.07065 | 155 | 1.6 | 11% |
| Example 2 | 0.5 | 0.19625 | 155 | 1.6 | 30% |
| Example 3 | 0.3 | 0.07065 | 310 | 1.6 | 22% |

Referring to Table 1, in the case of Comparative Example, it can be seen that a diameter of the recess is about 0.18 μm, and an area ratio is about 4%. That is, an area of the recess is 4 μm² based on an area of 100 μm². The area ratio of the recess may be controlled by adjusting the diameter or number of the recesses. As the area ratio of the recess increases, the number of second carrier injecting paths increases so that light emitting efficiency of blue light may increase.

In addition, when the area ratio of the recess increases, a discharge yield of static electricity may increase. Even when a size of the recess further increases, since the number of holes injected through the second recess sidewall 150a-1 increases, reduction of light intensity may be substantially prevented. That is, while a merit due to the recess is maintained, a demerit may be overcome.

Referring to FIG. 6, in the embodiment, a trigger layer 180 may be further disposed between the first conductive semiconductor layer 130 and the active layer 140. The trigger layer 180 may include a first trigger layer having a high In composition and a second trigger layer having a low In composition. Here, the In composition of the trigger layer 180 may be higher than that of the first conductive semiconductor layer 130.

Generally, a lattice of In is large. Accordingly, as a gallium nitride (GaN) layer contains a larger amount of In, a recess due to lattice mismatching may be more easily formed. However, a configuration for adjusting an area ratio of the recess is not limited thereto and may include any configuration for adjusting an area of the recess.

FIG. 12 is a view illustrating an analysis result of a conventional LED using a secondary ion mass spectroscopy (SIMS), and FIG. 13 is a view illustrating an analysis result of the LED according to one embodiment of the present invention using the SIMS.

Referring to FIG. 12, since a conventional EBL 150 is grown without an interruption period, as a thickness increases, a concentration of a p-type dopant increases. However, in an initial stage of growth, the p-type dopant is not easily doped due to a memory effect. Accordingly, the conventional EBL 150 has a peak P1 of one p-type dopant at a point at which the growth is completed.

However, referring to FIG. 13, the EBL 150 according to the embodiment has a first peak P2 at a central point of a thickness thereof and a second peak P3 at a point at which growth is completed by forming at least one interruption period during the growth.

Accordingly, by applying such a plurality of interruption periods, a plurality of peak sections may be formed in the thickness direction so that a concentration of a dopant may be increased.

FIG. 14 is a flowchart of a method of manufacturing an LED according to one embodiment of the present invention, FIG. 15 is a detailed flowchart of a process in which the EBL is formed, and FIG. 16 is a timing diagram for describing a process in which interfaces between sublayers are formed due to interruption periods.

Referring to FIG. 14, the method of manufacturing an LED according to one embodiment of the present invention includes forming an active layer 140 in which a plurality of first recesses 140a are formed (S10) and forming an EBL 150 formed on the active layer 140 in which the plurality of first recesses 140a are formed and including a second recess 150a (S20).

The forming of the active layer 140 (S10) includes forming a first conductive semiconductor layer 130 above a support substrate 110, and repeatedly forming a barrier layer and a well layer on the first conductive semiconductor layer 130. The first recess 140a caused by the electric potential D may be formed in the active layer 140.

The forming of the EBL (S20) may have a plurality of growth interruption periods for which supply of a raw material is stopped for a predetermined time period. Referring to FIG. 15, the forming of the EBL may include repeating a cycle of supplying a raw material in a nitrogen atmosphere (S21), stopping the supply of the raw material for a predetermined time period to stop growth (S22), and supplying the raw material again (S23) a plurality of times.

Referring to FIG. 16, the EBL has a plurality of interfaces 152 according to the number of interruption periods. As described above, during the interruption period, a p-type dopant is combined with the interface 152 and a doping concentration is increased in the interface 152. Here, materials of Ga, Al, Mg, and N may be trimethylgallium (TMGa), trimethylaluminum (TMAl), cyclopentadienyl magnesium ($CP_2Mg$), and ammonia ($NH_3$), respectively, but are not limited thereto. Here, the ammonia may be continuously supplied without the interruption period to maintain the nitrogen atmosphere.

The forming of the EBL may be variously modified. As an example, as an interval of the interruption period is controlled to be 2 sec, fifteen p-AlGaN layers having an Al composition of 20% may be formed, or the interruption period may also be controlled to be 5 sec. Alternatively, as the thickness of the layer is controlled to be 1 nm, a multilayer having thirty layers may also be formed.

FIG. 17 is a view for describing a process in which white light is realized using the LED according to the embodiment of the present invention.

Referring to FIG. 17, the LED 100 may emit light in which blue light BL emitted by the first well layer and green light GL emitted by the second well layer are mixed. A red phosphor 201 may convert a part of the mixed light into red light to realize white light WL. The red phosphor has wavelength conversion efficiency for green light higher than that for blue light. Accordingly, when an LED configured to emit green light as main light is used, light having a high CRI may be realized. The red phosphor 201 may further have properties by which the CRI of R9 is improved. The red phosphor may be a KSiF phosphor activated by Mn but is not limited thereto. According to the embodiment, the CRI of R12 may be improved by the blue light BL emitted by the LED 100. Accordingly, a CRI of the white light WL may be improved.

The LED according to the embodiment may further include optical members such as a light guide plate, a prism sheet, and a diffusion sheet and serve as a backlight unit. In addition, the LED according to the embodiment may be further applied to display devices, lighting device, and indicating devices.

Here, the display device may include a bottom cover, a reflective plate, a light emitting module, a light guide plate, an optical sheet, a display panel, an image signal output circuit, and a color filter. The bottom cover, the reflective plate, the light emitting module, the light guide plate, and the optical sheet may form a backlight unit.

The reflective plate is disposed on the bottom cover, and the light emitting module emits light. The light guide plate is disposed in front of the reflective plate to guide light emitted by the light emitting module forward, and the optical sheet includes a prism sheet and the like and is disposed in front of the light guide plate. The display panel is disposed in front of the optical sheet, the image signal output circuit supplies an image signal to the display panel, and the color filter is disposed in front of the display panel.

In addition, the lighting device may include a light source module including a substrate and the LED according to the embodiment, a heat sink configured to dissipate heat of the light source module, and a power supply configured to process or convert an electrical signal provided from the outside and supply the electrical signal to the light source module. Furthermore, the lighting device may include a lamp, a head lamp, a street lamp, or the like.

The above-described embodiments of the present invention is not limited to the above-described embodiments and the accompanying drawings, and it will be clear to those skilled in the art in which the embodiments of the present invention pertain that various substitutions, modifications, and changes may be made without departing from the technical spirit of the embodiments.

The invention claimed is:

1. A light emitting device comprising:
a first conductive semiconductor layer;
an active layer disposed on the first conductive semiconductor layer and including a plurality of first recesses;
an electron blocking layer including a bent region including a plurality of second recesses disposed on the first recesses and a flat region disposed between the plurality of second recesses; and
a second conductive semiconductor layer disposed on the electron blocking layer,
wherein a ratio of a doping concentration of the flat region to a doping concentration of the bent region is in a range of 1:0.8 to 1:1,
wherein the active layer generates a first light and a second light,
wherein the first light has a peak in a wavelength band of 450 nm to 499 nm,
wherein the second light has a peak in a wavelength band of 500 nm to 550 nm, and wherein the electron blocking layer includes a first carrier injecting path formed in the flat region and a second carrier injecting path formed in the bent region.

2. The light emitting device of claim 1, wherein the plurality of second recesses have a thickness smaller than that of the flat region.

3. The light emitting device of claim 1, wherein the electron blocking layer has at least two concentration peaks of a p-type dopant in a thickness direction thereof.

4. The light emitting device of claim 3, wherein:
the electron blocking layer includes a plurality of sublayers;
the p-type dopant has a concentration peak at interfaces between the plurality of sublayers; and
the interfaces between the plurality of sublayers overlap at a sidewall of the recesses.

5. The light emitting device of claim 1, wherein a peak intensity of the first light is in a range of 30% to 80% of a 100% peak intensity of the second light.

6. The light emitting device of claim 1, wherein:
the active layer includes at least one first well layer configured to emit the first light and at least one second well layer configured to emit the second light; and
a difference in content of indium (In) between the first well layer and the second well layer is 10% or more.

7. The light emitting device of claim 6, wherein the first well layer is disposed adjacent to the second conductive semiconductor layer based on a one-half point of the active layer in a thickness direction.

8. The light emitting device of claim 1, wherein:
the first light has a peak in a wavelength band of 470 nm to 490 nm; and
the second light has a peak in a wavelength band of 510 nm to 530 nm.

9. The light emitting device of claim 1, further comprising a trigger layer disposed between the first conductive semiconductor layer and the active layer,
wherein an indium (In) composition of the trigger layer is higher than that of the first conductive semiconductor layer.

10. The light emitting device of claim 1, wherein the active layer includes a first well layer configured to emit the second light and a second well layer configured to emit the first light.

* * * * *